US006970816B1

(12) United States Patent
Bryan et al.

(10) Patent No.: US 6,970,816 B1
(45) Date of Patent: Nov. 29, 2005

(54) METHOD AND SYSTEM FOR EFFICIENTLY GENERATING PARAMETERIZED BUS TRANSACTIONS

(75) Inventors: Paul David Bryan, Raleigh, NC (US); Richard Gerard Hofmann, Apex, NC (US); Peter Dean LaFauci, Holly Springs, NC (US); William Robert Lee, Apex, NC (US); Rhonda Gurganious Mitchell, Fuquay-Varina, NC (US); Timothy Patrick Oke, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 821 days.

(21) Appl. No.: 09/638,268

(22) Filed: Aug. 14, 2000

(51) Int. Cl.$^7$ .............................................. G06F 17/50
(52) U.S. Cl. ............................ 703/22; 703/13; 714/39
(58) Field of Search ............................ 703/22, 17, 14, 703/13; 716/4, 1, 6; 710/108, 306, 8; 714/33, 714/39, 38; 700/86; 713/600; 711/154; 707/2

(56) References Cited

U.S. PATENT DOCUMENTS

| | | | |
|---|---|---|---|
| 4,958,347 A | 9/1990 | White et al. | 714/43 |
| 5,724,504 A | 3/1998 | Aharon et al. | 714/33 |
| 5,774,358 A * | 6/1998 | Shrote | 700/86 |
| 5,778,194 A * | 7/1998 | McCombs | 713/600 |
| 5,815,688 A | 9/1998 | Averill | 716/4 |
| 5,867,400 A * | 2/1999 | El-Ghoroury | 716/1 |
| 5,898,705 A | 4/1999 | Graef | 714/7.38 |
| 5,930,482 A | 7/1999 | Carter et al. | 710/100 |
| 5,938,777 A | 8/1999 | Carter | 714/32 |
| 5,941,971 A | 8/1999 | Carter | 710/311 |
| 5,956,478 A * | 9/1999 | Huggins | 714/33 |
| 5,978,934 A | 11/1999 | Gates | 714/41 |
| 5,996,034 A | 11/1999 | Carter | 710/100 |
| 6,138,112 A * | 10/2000 | Slutz | 707/2 |
| 6,212,667 B1 * | 4/2001 | Geer et al. | 716/6 |
| 6,233,660 B1 * | 5/2001 | Vishlitzky | 711/154 |
| 6,236,956 B1 * | 5/2001 | Mantooth et al. | 703/14 |
| 6,243,835 B1 * | 6/2001 | Enokido et al. | 714/38 |
| 6,247,084 B1 * | 6/2001 | Apostol, Jr. et al. | 710/108 |
| 6,263,302 B1 * | 7/2001 | Hellestrand et al. | 703/17 |
| 6,321,285 B1 * | 11/2001 | Sheafor et al. | 710/306 |
| 6,336,152 B1 * | 1/2002 | Richman et al. | 710/8 |
| 6,378,088 B1 * | 4/2002 | Mongan | 714/39 |
| 6,571,204 B1 * | 5/2003 | Meyer | 703/22 |

FOREIGN PATENT DOCUMENTS

JP  10340251 A  12/1998  ......... G06F 13/362

OTHER PUBLICATIONS

IBM Technical Disclosure Bulletin, vol. 24, No. 7A, Dec. 1981, pp3282-3283 "Dynamic Processor Bus LSSD Simulation Modeling Technique".

* cited by examiner

*Primary Examiner*—Kevin J. Teska
*Assistant Examiner*—Kandasamy Thangavelu
(74) *Attorney, Agent, or Firm*—Connolly Dove Lodge & Hutz

(57) ABSTRACT

A method and system for efficiently generating parameterized bus transactions for verification of a design-under-test (DUT) comprises providing a configuration file for the DUT to a generator program. The configuration file defines possible parameter combinations for bus transactions executable by the DUT, and the generator program systematically enumerates all the possible combinations to produce a test case for verifying the DUT. Rules specified within the configuration file can include or exclude selected parameter combinations to tailor the test case to a specific DUT-to-bus interface.

16 Claims, 3 Drawing Sheets

METHOD AND SYSTEM FOR EFFICIENTLY GENERATING PARAMETERIZED BUS TRANSACTIONS

CROSS REFERENCE TO RELATED APPLICATIONS

This application is related by common inventorship and subject matter to co-pending applications titled "Method and System for Measuring and Reporting Test Coverage of Logic Designs" and "Method and System for Generating a Design-Specific Test Case From a Generalized Set of Bus Transactions". Until such time as the foregoing applications are assigned application numbers by the U.S. Patent and Trademark Office, they may be respectively referenced by the following applicant: Ser. No. 09/638,528 and Ser. No. 09/638,757. The listed applications are assigned to International Business Machines Corporation and are entirely incorporated herein by this reference.

BACKGROUND OF THE INVENTION

The present invention relates generally to the testing of logic designs, and more particularly to a method and system for automatically generating a test case for a design-under-test (DUT) from a configuration file for the DUT.

A process known as verification comprises applying test cases to a DUT and checking the results against expected results to determine whether the DUT functions correctly. Functional verification of logic designs which interface to standardized buses typically involves the use of a software tool known as a bus functional model (BFM). A BFM emulates a bus protocol to apply a test case in simulation to a DUT modeled by a hardware description language (HDL).

The BFMs allow verification engineers to write test cases as bus transactions. The bus transactions may be expressed in bus functional language (BFL) statements which are decoded and executed by the BFMs using a logic simulator. For example, a standardized BFM transaction test case for a 32 bit data slave design that uses read and write transactions with address, data, and control signal information could comprise BFL statements appearing as follows (comments indicated by "//"):

read(address=F0,be=1111,data=00000034) //4 byte read transaction from addr F0;
// byte enable (be) indicates // that bytes 0–3 are enabled;
// expected data value is 00000034;
write(address=F0,be=1000,data=12000000) // 1 byte write transaction to addr. F0;
// byte enable indicates that byte 0 // is enabled, and bytes 1–3 are not // enabled;
// 1 byte write data is 12;
read(address=F0,be=1111,data=12000034) // 4 byte read transaction from // address F0;
// byte enable indicates that bytes 0–3 // are enabled;
// expected data value is 12000034;

In the foregoing example, read and write are two different transaction types, while address, byte enable, and data are parameters of the respective transaction types. The parameters were used to specify data to be written to an address, and to subsequently read the address to determine whether the data was correctly written.

In order to verify that a DUT completely complies with a standardized bus interface, all possible bus transactions must be performed to ensure that the DUT-to-bus interface operates under all legal bus conditions. This process, also known as regression testing, entails the enumeration of all possible and legal transaction combinations to ensure a complete and correct design.

Typically, test cases for applying all the possible and legal transactions for a DUT-to-bus interface must be specified manually, as BFL statements as shown in the above example. To code the BFL statements, a verification engineer must usually consult a bus architecture specification manual. As the complexity of logic designs increases, the number of transactions which must be applied to a design to fully test it for bus compliance becomes unmanageable by a manual procedure. The procedure becomes unduly time-consuming, and the likelihood that coding errors occur or that needed test cases are omitted increases.

In view of the foregoing, a method and system for efficiently generating test cases is called for.

SUMMARY OF THE INVENTION

According to the present invention, a method and system are provided for automatically generating test cases from a DUT configuration file. The configuration file includes specifications of possible parameter combinations in bus transactions corresponding to the DUT. The configuration file may be processed by a generator program according to the invention to automatically generate a test case comprising bus transactions for verification of the DUT.

In an embodiment, the configuration file expresses transaction types and possible parameter combinations in a condensed format which is expanded or enumerated by a generator program to create a test case. The configuration file may include rule which are interpreted by the generator program to select parameter combinations to be included or excluded in the test case.

The condensed syntax of the configuration file allows a DUT to be described in an economical and compact way, eliminating much of the time, effort and probability of coding error which is inherent in the manual procedure described above. Instead, the generator program performs the work of generating or enumerating all the possible transactions necessary to fully verify a DUT. The inclusion of rules as described allows the configuration file and resultant test case to be easily customized to a specific DUT.

DETAILED DESCRIPTION OF THE INVENTION

Figure 1:
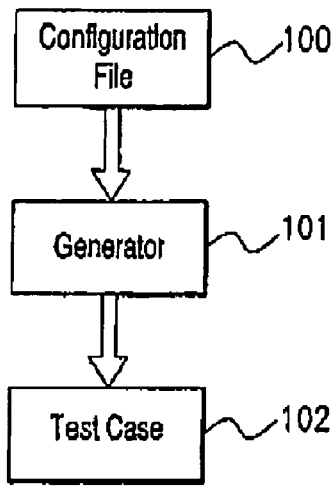
FIG. 1 shows a functional block diagram representative of the invention.
Figure 2:
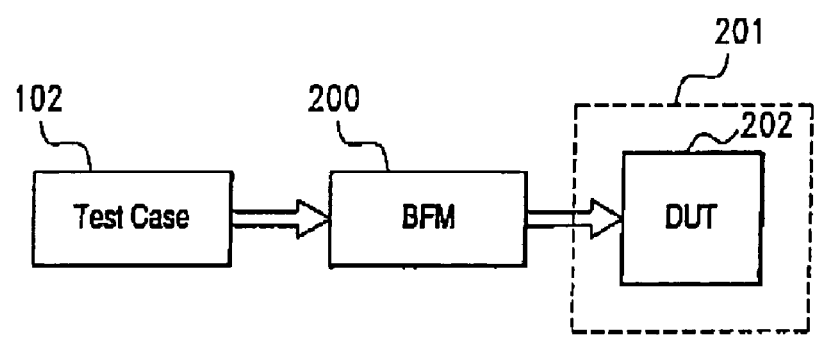
FIG. 2 is a functional block diagram showing the use of a BFM to apply a test case to a DUT.

Referring now to FIG. 1, according to the present invention, a configuration file 100 is input to a generator program 101. The generator 101 processes the configuration file to produce a test case 102 comprising one or more bus transactions. As shown in FIG. 2, typically a BFM 200 applies the test case to a DUT 202 being simulated by a logic simulator 201, in order to verify the DUT.

A condensed or compact syntax for the configuration file according to the invention allows for a description of a DUT, in terms of the bus transactions it performs, to be expressed in an economical form with a minimum of effort and probability of coding error. A description of a possible embodiment of the syntax follows. Comments are indicated by "//". It is noted that the form of the syntactical statements described is arbitrary and merely representative of functionality which could be implemented in a wide variety of symbolic formulations suitable for being parsed by a parsing routine.

Configuration [name]

This syntactical statement specifies a bus architecture type. Each bus architecture is characterized by a set of transactions, and typically a subset of those transactions constitutes an interface with a given DUT.

Path [device_path]

This syntactical statement specifies a logical path in a testing system hierarchy to a device or software entity, such as a BFM, that is used to apply a test case to a DUT.

device_Type[name]

This syntactical statement specifies a type of device in a given bus architecture, such as a slave, master or arbiter, used to apply a test case to a DUT.

Iterations [integer]

This syntactical statement specifies a maximum number of bus transactions a user wishes the generator to output to an output file. If this statement is not included in the configuration file, then the generator will simply output all possible bus transactions (depending on rule specifications) corresponding to parameter definitions in the configuration file.

File_Size [integer]

This syntactical statement specifies a maximum number of bus transactions for the generator to output per file. When the maximum number is reached, the generator creates a new output file and begins outputting to the new output file.

Traverse [1 or 0]

This syntactical statement allows a user to direct the generator to continue enumerating bus transactions once a maximum number specified by the iterations statement, for example, has been reached, but without outputting the transactions to an output file.

Trans_Type
   [command1] [command2] [command3] . . .

End_Trans_Type

This syntactical statement specifies bus transaction types ("command"). Examples include "read" and "write". The generator will generate bus transactions of the transaction types and including parameter combinations as determined by a command statement, discussed below.

Generate
   // specification of a list of transaction types
   list [command1] [command2] [command3] . . .
   // specification of an integer=n, where n is a number of transaction types to be selected at random from the trans_type list
   uniform [integer]

End Generate

This syntactical statement specifies a way in which bus transaction types are generated by the generator program. In the list format, a user lists transaction types. The generator will generate all the possible combinations of the listed transaction types, along with associated parameters as specified by the command statement described below.

An alternative format for the generate syntactical statement is to specify the keyword uniform followed by an integer. This format will cause the specified integer number of transaction types to be selected at random from the list set forth in the trans_type statement.

Passthrough [pregen or postgen] [all or number]
   [Initialization/Termination command1]
   [Initialization/Termination command2]

End Passthrough

This syntactical statement allows the user to specify initialization or termination commands for being included in a test case. The initialization or termination commands are not processed by the generator, but are instead simply "passed through" directly to the generator output file. The pregen keyword causes initialization commands to be inserted ahead of generated bus transactions, while the postgen keyword causes termination commands to be inserted after generated bus transactions. The parameter all may be specified to have the pregen or postgen commands passed to all test cases, or a particular test case may be specified by number to receive pregen or postgen commands.

Command
   // for an enumerated list
   [parameter name] [enum] [item1] [item2 [ item3] . . .
   // for a range of values, or a uniform random distribution within a range
   [parameter name] [uniform or range] [min_value] [max_value] [step] /step_value]
   // for type range: step and step_value are optional End Command This syntactical statement allows a user to specify all of the parameters, and all of the possible parameter values for each parameter, that are valid for a given bus architecture.

Following the command identifier are parameter combination specifications. Possible formats for specifying parameter combinations include enum, uniform, and range, as shown. For parameter combination specifications of type enum, the parameter values follow the keyword enum in the form of an enumeration list. As discussed in greater detail below, when the generator processes a parameter combination specification of the enum type, it will combine each of the listed parameter values with other parameter specifications of the command statement using an enumeration routine. Depending upon applied rules, the generator will output the combinations, typically in the form of bus transactions, to an output file.

For parameter combination specifications of type uniform and range, a user specifies minimum (min_value) and maximum (max_value) values following the corresponding keyword. For specifications of type uniform, the generator will choose a random value between the minimum and maximum values when generating parameter combinations.

For specifications of type range, a user may choose a step value or increment between the minimum and maximum values. This is accomplished through the use of the step keyword followed by a value indicating the step value (step_value). When processing parameter combination specifications of type range, the generator sets the parameter to the minimum range value and then increments the value by the specified step value to generate parameter combinations. The step and step_value keywords are optional. If step and step_value are not included within the parameter combination specification, then the step_value defaults to 1 and all possible values within the minimum and maximum values are generated.

Different formats may be used for range and uniform specifications, including decimal, binary, and hexadecimal. To specify a format, special characters may be included before the min_value and max_value keywords. Hexadecimal may be chosen by including an "x" character and binary by including a "b". Preferably, decimal is the default.

Examples:
   x10 // hexadecimal value, equal to 16 decimal
   b10 // binary value, equal to 2 decimal
   10 // decimal value Rule [include or exclude] [rule_name]// Optional Rule Specifications
   [eq or ne] [parameter name] [item 1] [item2] [item3]
   [lt or gt] [parameter name] [value]
   [eq or ne] [parameter name] [mask] [mask_value] [value] [test_value]

End_Rule

This syntactical statement allows a user to restrict the total set of bus transactions generated, as defined by the command specifications, to possible subsets for output. Rules may specify the actions exclude or include to exclude or include, respectively, a combination of parameters and parameter values for the bus transactions, based upon the results of tests specified by the user. The tests include different types of relational operators, such as: equal (eq), not equal (ne), less than (lt), or greater than (gt).

In the first format shown above for specifying a test (the line reading [eq or ne] [parameter name] [item 1] [item2] [item3]), each combination of a list item ([item 1], [item2], or [item3]) with [parameter name] is compared to a generated combination using the specified relational operator [eq or ne]. Each test returns a true condition or a false condition.

In the second format shown (the line reading [lt or gt] [parameter name] [value]), [parameter name] is compared with [value] using the specified relational [lt or gt]. Each test returns a true condition or a false condition.

In the third format shown, tests may be specified using a mask format. With the mask format, the value specification is masked with the mask_value specification. The result is then tested against test_value using the appropriate relational operator (eq or ne).

If all the tests specified in a rule return a true condition, then the specified action is performed. That is, if all tests return a true condition and the rule specifies include, the parameter combination is included in the generator output file. If the rule specifies exclude, the parameter combination is not output to the output file.

If any test returns a false condition, then the action opposite to the action specified is performed. That is, if any test returns a false condition and the action specified is include, the parameter combination is excluded from the output file. If the action specified is exclude, the parameter combination is included in the output file.

If more than one rule is stated in a configuration file, a first logical AND operation is performed with the conditions returned by evaluating all the tests specified for exclude actions. A logical OR operation is performed with the conditions returned by evaluating all the tests specified for include actions.

Then, a second logical AND operation is performed with results of the first logical AND and the logical OR operations. The second logical AND operation returns a true or false condition to determine whether to include the parameter combination or combinations for which rules are specified.

If no rules are included in a configuration file, all the parameter combinations corresponding to the command statement specification are generated or enumerated. As described above, the iterations statement may limit the number of transactions output to the output file.

Rule [NA] [parameter name] (Optional)
   [eq or, ne] [parameter name] [item1] [item2] [item3]
   [lt or gt] [parameter name] [value]
   [eq or ne] [parameter name] [mask] [mask_value] [value] [test_value]

End_Rule

This syntactical statement allows for the omitting of certain parameters under specific conditions during test case generation. The tests under the NA (Not Applicable) formulation use relational operators as in the include/exclude rules described above.

In order for a parameter to be evaluated as Not Applicable and therefore excluded from the generator output, all the tests specified must return a true condition. If this true condition occurs, the parameter name specified in [parameter name] is excluded from a currently selected list of parameter values generated by the generator. The NA formulation for a rule serves to filter single parameters located within the currently selected list.

End_Configuration

This syntactical statement denotes the ending of the configuration file.

Figure 3:
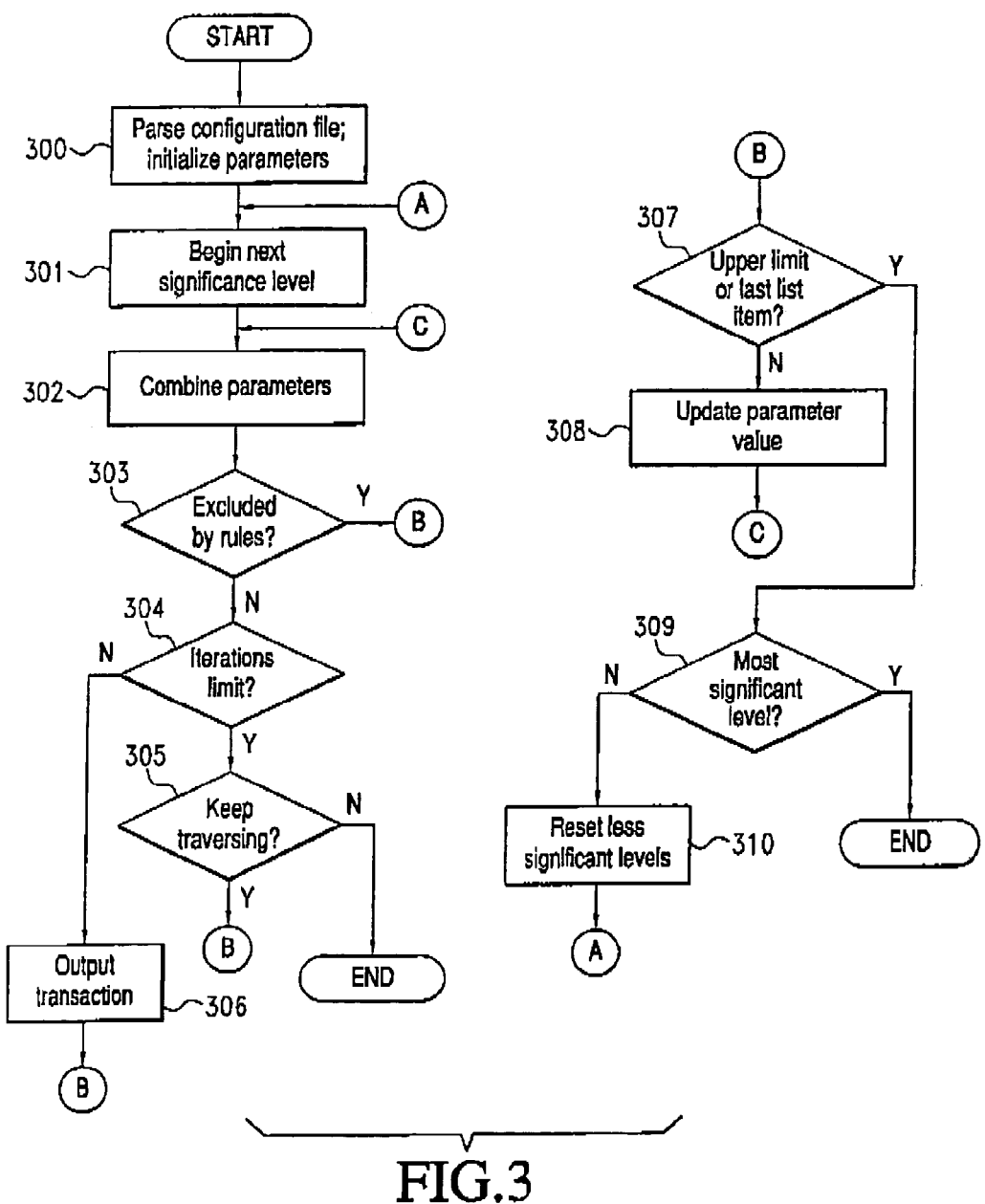
FIG. 3 illustrates a process flow according to the invention.

FIG. 3 shows a process flow for the generator 101, given a configuration file 100 specified in the above-described syntax as input. As shown in block 300, initially the generator parses the configuration file and initializes parameter values. All range specifications are set to their respective lower limits, or min_values, and all enumeration lists are set to their first listed item.

In order to systematically enumerate each possible parameter combination, the generator assigns a significance level to each parameter combination specification in a command statement, based on its place in a sequence within the command statement. In an embodiment, the parameter combination specification last in the sequence is the least significant, the next-to-last parameter combination specification is next-to-least significant, and so on up to the first or most significant specification in the sequence.

As shown in block 301, enumeration or generation of parameter combinations begins with the level of least significance (initially the "next" significance level is the least significant level). As shown in block 302, the generator combines parameter values at each significance level, at their current state, to form a parameter combination.

As each parameter combination in the command statement is generated, it is checked against any rules which may be defined in the configuration file, as shown in block 303. If the generated parameter combination is not excluded by a rule, the generator checks for whether an iterations limit as specified in an iterations statement as described above has been reached, as shown in block 304. If the combination is excluded by a rule, the flow proceeds to block 307.

If an iterations limit has been reached, as shown in block 305 the generator checks for whether to keep traversing the command structure to form parameter combinations, but without outputting them, as specified in the traverse statement described above. If traverse has not been set to "1", the generator stops. Otherwise, the flow proceeds to block 307.

If an iterations limit has not been reached, the parameter combination is output to an output file, typically in the form of a bus transaction, as shown in block 306.

At block 307, the generator checks for whether an upper limit of a specified range has been reached within the current significance level. In the case of an enumeration list, the generator checks for whether all items of the list have been visited or traversed.

As shown in block 308, if within the current significance level the upper limit of a range has not been reached or all the items of an enumeration list have not been traversed, the parameter value of the range is updated (by step_value if specified or by 1 if not) or the next list item is fetched or visited. Then, the resulting parameter combination is checked against the rules, if any.

When the upper limit of a range is reached or all list items of an enumeration list have been traversed, the generator moves up to the next significance level. As shown in block 309, if all significance levels have been processed, the generator is finished and exits. If not, as shown in block 310 the generator resets all levels of lesser significance than the next level to be processed to their initial values, i.e., to the lower limit of a range or to the first item in an enumeration list, and processes the next level.

It may be observed that the foregoing resembles the functioning of a mileage odometer, in that digits of an odometer, corresponding to significance levels in the above, run through all possible values, beginning with the least significant digit.

The following is an illustrative example of the foregoing enumeration process:

```
command
    address range x0A x0C
    // The above is a command statement in the configuration
file syntax. The first and // most significant parameter
combination specification is a range type of // specification
for parameter name=address. The lower limit or min_value
for the // range is x0A, and the upper limit or max_value is
x0C. No step value is specified, // so beginning with the
lower limit, the range will be incremented by the default step
// value which is 1;
    be enum 000 111
    // The above is an enum or enumeration list type of
parameter combination // specification for parameter
name=be (byte enable) comprising two list items, 000 // and
111. This is the least significant parameter combination
specification in the // command statement;
end_command
```

From the above command specification, the generator would produce the following parameter combinations:

```
address=0A, be=000
address=0A, be=111
address=0B, be=000
address=0B, be=111
address=0C, be=000
address=0C, be=111
```

As can be seen, the generator traversed the least significant level first, pairing each list value with the initial range value, 0A, of the next significance level. Then, the next significance level was processed. The range value was incremented to 0B, the level of lower significance was reset to its initial value, and the generator produced the next possible combinations. Finally, the upper limit, 0C, of the most significant level was reached and each combination at that level was generated.

The following is an example of application of a rule in a configuration file to the above-described command definition:

```
rule exclude
    eq address x0C
    eq be 111
end_rule
```

In the above rule specification, the specified tests are that if a parameter combination having an address equal (eq) to x0C and a "be" parameter equal to 111 is generated, the combination is to be excluded from the generator output. Thus, if this rule was present in the configuration file with the above command definition, the generator would produce the following output:

```
address=0A, be=000
address=0A, be=111
address=0B, be=000
address=0B, be=111
address=0C, be=000
```

It can be seen that, because both tests returned a true condition for the parameter combination "address=0C, be=111", this combination was excluded from the generator output.

The following is another example of a configuration file and resulting generator output:

Configuration File:
```
configuration plb_device
// The bus is a plb (processor local bus);
path /plb_complex/m0/master
device_type plb_master
// Path and device type specifications;
trans_type
    read write
end-trans_type
// Transaction types are "read" and "write";
generate
    list write
end_generate
// This generate statement will cause the generator to
produce write transactions. If // uniform[integer] were speci-
fied instead, the generator would randomly select // trans-
action types from the trans_type specification;
passthrough pregen
    wait (level=0)
end_passthrough
// Passthrough statement;
command
    address range x0001 EEE0 x0001 EEE8
    be enum 000 11
end_command
// Command statement with two parameter combination
specifications. The most // significant is a range type with a
lower limit of x0001 EEE0 and an upper limit of // x0001
EEE8; the least significant is an enumeration list with 000 as
the first list // item and 111 as the last list item;
passthrough postgen
    send (level=1)
end_passthrough
// Passthrough statement;
rule exclude
    gt address x0001 EEE0
end_rule
// This rule will exclude all generated address parameters
having a value greater than // x0001 EEE0;
end_configuration
```

Generator Output (Bus Transactions in Bus Functional Language):
```
set_device             (path=/plb_complex/m0/master,
    device_type=plb_master)
// Device and path definitions;
    wait (level=0)
    write(address=0001EEE0, be=000)
    send (level=1)
```
// From the specification of the generate statement, the generator produced a "write" // bus transaction. At the least significant level of parameter combination // enumeration, with be=000, all address parameter values for the write // transaction greater than x0001 EEE0 were excluded by the rule. The // passthrough statements caused their respective commands to be inserted before and // after the write transaction;
```
    set_device             (path=/plb_complex/m0/master,
        device_type=plb_master) // Device and path definitions;
    wait (level=0)
    write(address=0001EEE0, be=111)
    send (level=1)
```
// At the least significant level of parameter combination enumeration, with be=111, // all address parameter values for the write transaction greater than x0001 EEE0 // were excluded by the rule. The passthrough statements caused their respective // commands to be inserted before and after the write transaction.

It may be appreciated from the foregoing that the present invention provides a general purpose bus command syntax with rule specification. The rule specifications within the configuration file allow complex logical expressions to be included with the test case generation process. The rule specification feature, together with the generator program, facilitate an automatic method for the generation of tests which comply with any bus architecture specification having an associated bus model toolkit. One hundred percent compliance test case generation capability with the complete generation of all bus transactions is achieved.

Figure 4:
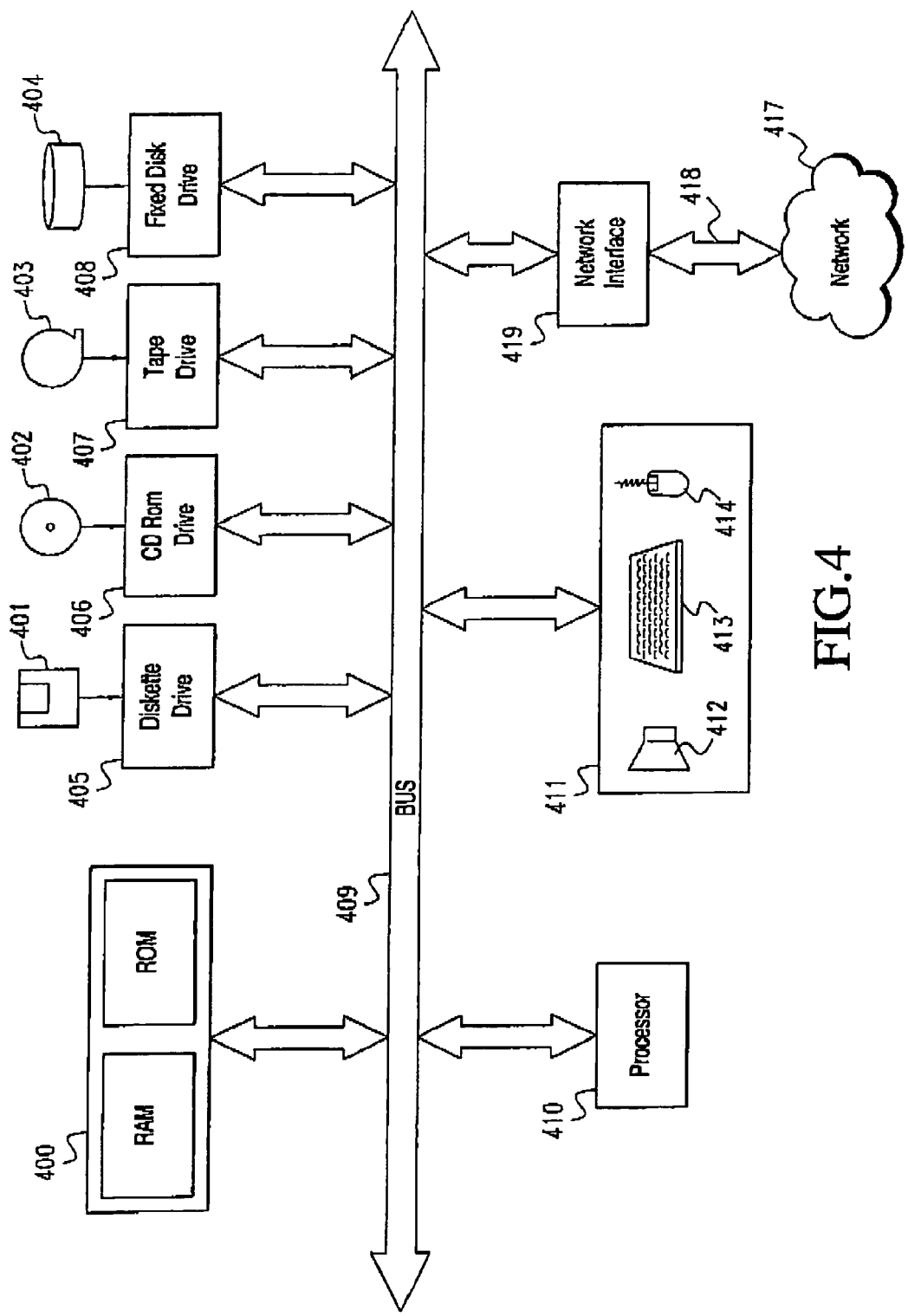
FIG. 4 shows a computer system for practicing the method of the invention.

FIG. 4 shows a high-level representation of a computer system for implementing a preferred embodiment of the present invention, such as might be realized by a variety of known and commercially available hardware and software elements as embodied in, for example, a UNIX® workstation. The system comprises a memory 400 including ROM and RAM, processor 410 and user interface 411 comprising a video display 412, keyboard 413 and mouse 414. Elements may communicate via system bus 409. The system may further comprise a network 417 connected by a network medium 418 and network interface 419.

A computer program or collection of programs comprising computer-executable instructions for performing method steps according to the present invention may be stored and transported on computer-usable media such as diskette 401, CD-ROM 402, magnetic tape 403 and fixed disk 404. To perform the steps of the method, computer instructions according to the present invention may be retrieved from the computer-usable media 401–404 using their respective drives 405–408 into memory 400, and executed by a processor 410. The process steps and functionality disclosed hereinabove for performing the method may find specific implementations in a variety of forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for generating test cases for verification of a device under test (DUT) comprising:
   providing a device-under-test (DUT) configuration file comprising a specification of bus transaction types and parameters corresponding to said DUT;
   providing rules in said configuration file to include or exclude selected ones of bus transactions from a test case;
   evaluating said rules in said configuration file to include or exclude selected ones of said bus transactions from said test cases; and
   processing said configuration file to generate said test cases comprising bus transactions for verification of said DUT.

2. The method of claim 1, wherein said processing step comprises converting said specification into a plurality of combinations of said parameters.

3. The method of claim 1 said DUT for verification comprising applying said bus transactions to said DUT for verification.

4. A method for generating test cases for verification of a device under test (DUT) comprising:
   describing said DUT in a configuration file comprising a specification of bus transaction types and parameters using a condensed syntax;
   providing rules in said configuration file to include or exclude selected ones of bus transactions from a test case;
   applying said rules in said configuration file to include or exclude selected ones of said bus transactions from said test cases; and
   generating test cases for verification of said DUT by converting said condensed syntax into an enumeration of possible parameter combinations for bus transactions of said DUT.

5. The method of claim 4, wherein said syntax specifies a range of parameter values for said bus transactions.

6. The method of claim 4, wherein said syntax specifies transaction types, a set of parameters for each transaction type, and directives for determining a mode of said converting.

7. The method of claim 6, wherein said directives cause a value for said parameters to be stepwise incremented.

8. The method of claim 6, wherein said directives cause values for said parameters to be evaluated as a list.

9. The method of claim 6, wherein said directives cause said transaction types to be selected at random.

10. A computer-usable medium storing computer-executable instructions, said instructions when executed implementing a process for generating test cases for verification of a device under test (DUT) comprising:

providing a device-under-test (DUT) configuration file comprising a specification of bus transaction types and parameters corresponding to said DUT;

providing rules in said configuration file to include or exclude selected ones of bus transactions from a test case;

evaluating a syntax of a DUT configuration file including statements defining bus transaction types and parameters corresponding to said DUT;

testing a parameter combination generated from said configuration file against said rules;

generating bus functional language statements from said syntax; and outputting said parameter combination in said bus functional language statement when said parameter combination is not excluded by said rules.

11. A system for generating test cases for verification of a device under test (DUT) comprising:

a memory including computer-executable instructions;

a processor coupled to said memory for executing said instructions; and a configuration file for said DUT including bus transaction types and parameters corresponding to said DUT;

wherein said configuration file includes rules for including or excluding selected bus transactions from being generated;

wherein said instructions process said configuration file to generate bus transactions for verification of said DUT; and wherein said instructions apply said rules in said configuration file to include or exclude selected ones of said bus transactions from said test cases.

12. A method for generating test cases for verification of a bus interface comprising:

preparing specifications of parameter combinations corresponding to bus transactions of a device under test;

forming a configuration file of said parameter combinations in a condensed syntax including commands and rules to select various parameter combinations to be included in or excluded from the test case; and generating from said configuration file all bus transactions defined by said rules comprising said test case; and storing said bus transactions in an output file for use in a bus simulator.

13. A method for generating a test case for a buss interface according to claim 12 wherein said configuration file includes statements defining transaction types to be generated and command statements which specify the parameters associated with each transaction type.

14. The method for generating a test case according to claim 13 wherein said command identifies a subset of said parameters which limits the number of transactions in said test case.

15. The method for generating a test case according to claim 14 wherein said command statement identifies a significance level with each parameter combination.

16. The method according to claim 15 wherein said generator generates a transaction from each parameter of said command statement beginning with the lowest level of significance.

* * * * *